United States Patent
Lindgärde et al.

(10) Patent No.: US 10,296,674 B2
(45) Date of Patent: May 21, 2019

(54) METHOD FOR A VEHICLE

(71) Applicant: VOLVO TRUCK CORPORATION, Göteborg (SE)

(72) Inventors: Olof Lindgärde, Hovås (SE); Rune Prytz, Arlöv (SE); Daniel Blom, Malmö (SE)

(73) Assignee: Volvo Truck Corporation, Göteborg (SE)

( * ) Notice: Subject to any disclaimer, the term of this patent is extended or adjusted under 35 U.S.C. 154(b) by 397 days.

(21) Appl. No.: 14/897,078

(22) PCT Filed: Jun. 19, 2013

(86) PCT No.: PCT/EP2013/001804
§ 371 (c)(1),
(2) Date: Dec. 9, 2015

(87) PCT Pub. No.: WO2014/202100
PCT Pub. Date: Dec. 24, 2014

(65) Prior Publication Data
US 2016/0117427 A1    Apr. 28, 2016

(51) Int. Cl.
*G06F 17/50* (2006.01)
*G05B 23/02* (2006.01)

(52) U.S. Cl.
CPC ..... *G06F 17/5009* (2013.01); *G05B 23/0243* (2013.01)

(58) Field of Classification Search
CPC .................. G06F 17/5009; G05B 23/0243
See application file for complete search history.

(56) References Cited

U.S. PATENT DOCUMENTS

2003/0216856 A1*  11/2003  Jacobson ............. F02B 37/00
                                                    701/114
2004/0002776 A1*   1/2004  Bickford ........... G05B 23/0254
                                                    700/30
2010/0114810 A1    5/2010  Hoyte et al.
(Continued)

FOREIGN PATENT DOCUMENTS

CN    101858826 A    10/2010
CN    102434291 A     5/2012
(Continued)

OTHER PUBLICATIONS

Japanese Official Action (dated Sep. 7, 2017) for corresponding Japanese App. 2016-520286.
International Search Report (dated Dec. 20, 2013) for corresponding International App. PCT/EP2013/001804.
Chinese Official Action (dated May 4, 2017) for corresponding Chinese App. 201380077626.6.
(Continued)

*Primary Examiner* — Aniss Chad
*Assistant Examiner* — Chuen-Meei Gan
(74) *Attorney, Agent, or Firm* — WRB-IP LLP

(57) ABSTRACT

A method for providing a model for a part of a vehicle includes selecting at least one operation state, selecting at least one possible fault type for the vehicle part, simulating vehicle part performance for the at least one operation state during the occurrence of the at least one possible fault type, for each simulation creating a representation of the vehicle part performance in which each representation is associated with at least one operating parameter value, and storing the at least one representation.

8 Claims, 4 Drawing Sheets

(56) References Cited

U.S. PATENT DOCUMENTS

| | | | |
|---|---|---|---|
| 2012/0179326 A1* | 7/2012 | Ghelam | G05B 17/02 701/31.9 |
| 2012/0215509 A1* | 8/2012 | Callot | G05B 23/0243 703/7 |
| 2012/0290190 A1 | 11/2012 | Kim et al. | |

FOREIGN PATENT DOCUMENTS

| | | |
|---|---|---|
| DE | 10257793 A1 | 7/2004 |
| JP | H05286115 | 11/1993 |
| JP | H07306121 | 11/1995 |
| JP | h09159578 | 6/1997 |
| JP | H09330120 | 12/1997 |
| JP | 2009146072 | 7/2009 |
| JP | 2011094587 | 5/2011 |

OTHER PUBLICATIONS

Neural Network-Based Study of Diagnosis of Misfire Faults of an Internal Combustion Engine, Gong Huanchun, Beijing Automobile, No. 5 of2010, section 2.3 on p. 20 and section 2.5 on p. 22 ofthe text, Tables I and 3, Oct. 2010.

The Development and Research of On-Boa rd Diagnostics System for Common Rail DI Diesel Engine, Liang Feng, Chinese Master's Theses Full-text Databases (Doctor), Engineering Science and Technology 2, No. 6 of 2007, Section 3.I .R of the text, Jun. 2007.

Faul t self-diagnosis techniques for automotive electronic control system, Qin Guihe, etc., Automotive Engineeri ng, vol. 22, No. 4, Section 2.1 of the text, Dec. 2000.

Japanese Official Action (dated Feb. 23, 2017) for corresponding Japanese App. 2016-520286.

* cited by examiner

METHOD FOR A VEHICLE

BACKGROUND AND SUMMARY

The present invention relates to a method for a vehicle, in particular to a method for providing an on-board model used to determine faults in a part of a vehicle, such as an internal combustion engine. Further, the present invention relates to a method for determining faults in a vehicle being provided with such on board model.

Heavy vehicles such as trucks, construction vehicles, etc. are usually driven by an internal combustion engine (ICE). The ICE is typically a diesel engine provided with one or more turbochargers. Trucks are normally operated under extreme conditions, such as long distances and long driving periods. Once the vehicle is subject to a fault requiring service or maintenance the cost for the truck owner is rapidly increasing. Hence, in many cases it is desirable to detect faults early, preferably before such faults causes unplanned downtime of the vehicle.

For this, model based approaches have been suggested. Typically such approaches require a model representing specific parts of the vehicle, e.g. the turbocharger. The model requires one or more inputs corresponding to actual driving parameters, and delivers one or more outputs. Said outputs are compared with actual parameter values obtained during driving, and a match between the actual parameter values and said outputs indicates that the specific part of the vehicle is functioning properly. Correspondingly, a deviation between the actual parameter values and the outputs indicates a malfunction.

Another method is described in US20120290190. This document describes a method for diagnosing an exhaust gas recovery (EGR) system. The measured or actual EGR gas temperature is compared to an EGR gas temperature that has been empirically determined and stored in a table or function in a memory of a controller. If the actual EGR temperature is less than or greater than the empirically determined EGR gas temperature by more than a predetermined amount, EGR system degradation based on EGR gas temperature may be determined and recorded to memory.

Although there are currently proposed methods providing fault detection in vehicles, it has been proven to be very difficult to provide a sufficiently accurate and reliable method in these applications. First of all, a vehicle is a very complex construction with a vast amount of critical machine parts of which proper functioning is critical for the overall vehicle performance. This particularly applies to the engine, as well as to associated parts such as the exhaust gas flow path. Secondly, the resources for performing such methods on board are very limited, both in terms of available memory as well as processing power.

In view of these limitations there is need for other methods for allowing fault detection in vehicles. More particularly there is a need for improved methods allowing various faults to be detected on board the vehicle, as well as methods which are easy to expand to further parts of vehicle, thus allowing the detection of various faults also in such additional parts.

Accordingly, it is desirable to mitigate or eliminate the above-identified deficiencies in the art and disadvantages singly or in any combination.

An idea of an aspect of the invention is to provide a model for a part of a vehicle, such as an internal combustion engine, wherein a specific operation state is simulated for one or more fault types thus resulting in one or more simulations, and wherein each simulation is stored as a representation of one or more operating parameter values.

A yet further idea of the invention is to store such representations in a vehicle, and use such representations for comparing the stored operating parameter values with measured values during vehicle operation. By performing such comparison for each one of the representations, i.e. for the different fault types, it is possible to determine which fault type is most likely to be present.

According to a first aspect of the invention a method for providing a model for a part of a vehicle is provided. The method comprises the steps of selecting at least one operation state; selecting at least one possible fault type for said vehicle part; simulating vehicle part performance for said at least one operation state during the occurrence of said at least one possible fault type; for each simulation creating a representation of said vehicle part performance in which each representation is associated with at least one operating parameter value; and storing said at least one representation.

The method may further comprise the steps of simulating vehicle part performance for said at least one operation state with no fault type occurring; and for said simulation with no fault type occurring creating a representation of said vehicle part performance in which said representation is associated with at least one operating parameter value. Hence, the model also includes representations for a fault-free vehicle part.

Said operation state may correspond to a specific driving characteristics for a specific surrounding condition, and said fault type may correspond to a specific fault with a specific magnitude.

The step of simulating vehicle part performance may be performed for each one of said at least one operation state during the occurrence of each one of said at least one possible fault type, resulting in a set of unique simulations.

Further, said vehicle part may be an internal combustion engine, or parts thereof, and wherein each one of said representations is a series of operating parameter values for a specific output torque, a specific engine speed, a specific ambient condition, and a specific fault type.

In an embodiment, said vehicle part may be an internal combustion engine, and said at least one operating parameter may be selected from the group consisting of: turbocharger boost pressure, turbocharger inlet pressure, turbocharger speed, turbocharger outlet temperature, turbocharger inlet temperature, and/or exhaust gas recovery temperature.

According to a second aspect, an electronic control unit is provided. The electronic control unit has a memory storing a model according to the first aspect.

According to a third aspect, a method for identifying faults of a part of a vehicle during operation is provided. The method comprises the steps of determining an actual operation state of said vehicle part; receiving a value of at least one operating parameter from each one of a plurality of stored representations, which correspond to said determined operation state for different fault types, for which each one of said representations is associated with at least one operating parameter value; detecting at least one actual value of said at least one operating parameter; and identifying a specific fault type associated to a specific representation for which the at least one received operating parameter value is most similar to said detected actual operating parameter value.

The step of identifying a specific fault type may further comprise computing residuals between the received operating parameter values and the detected actual operating parameter values for each one of said representations; selecting one representation for which said residuals have a minimum variance; and identifying a specific fault type associated with the selected representation.

Further, the step of detecting at least one operating parameter value may be repeated for detecting a series of actual values for said at least one operating parameter.

According to a fourth aspect, a computer program product is provided. The computer program product comprises program code means stored on a computer readable medium for performing all steps of the method according to the third aspect when said program product is run on a computer.

BRIEF DESCRIPTION OF DRAWINGS

Hereinafter, the invention will be described with reference to the appended drawings, wherein.

DETAILED DESCRIPTION

Figure 1:
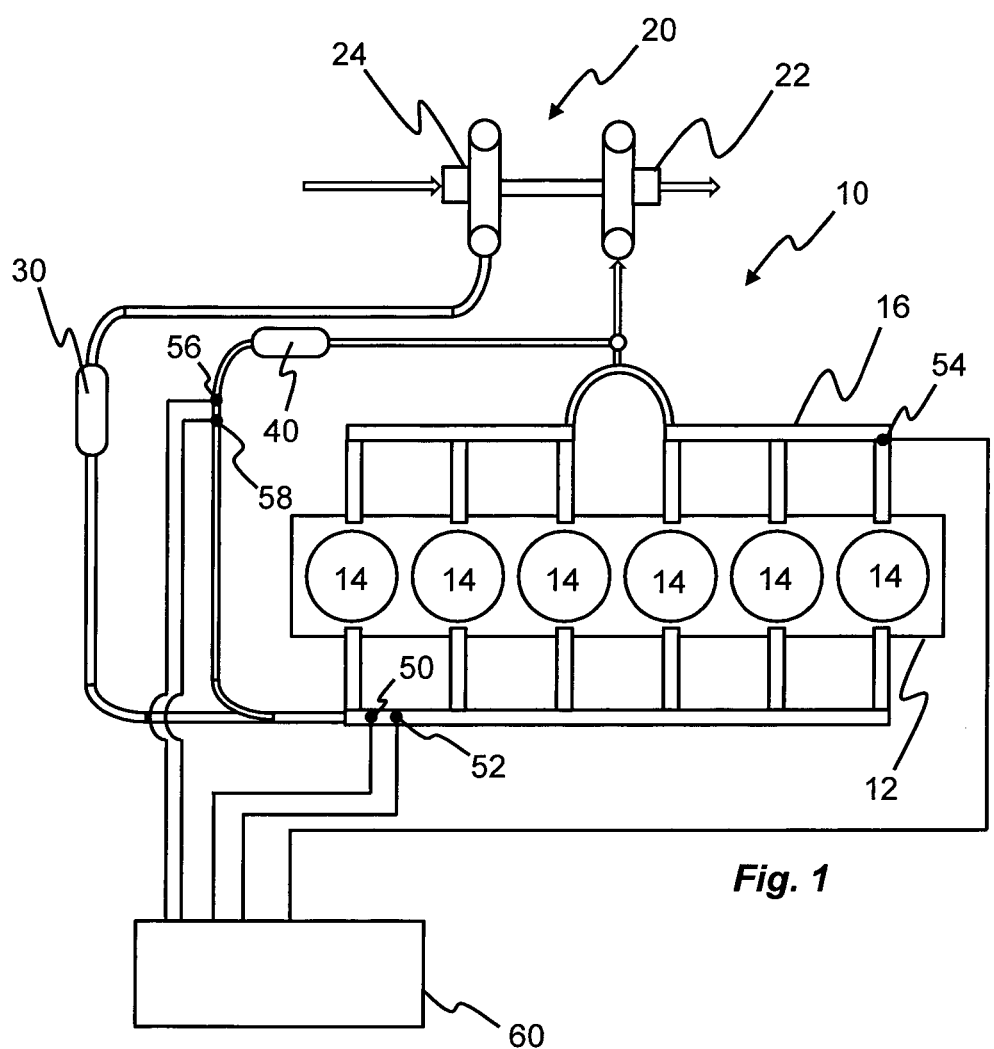
FIG. 1 is a schematic view of an internal combustion engine.

Starting with FIG. 1, an internal combustion engine (ICE) 10 is shown. An engine block 12 houses a plurality of cylinders 14 each being connected to a manifold 16. The manifold 16, in this particular application being divided into two parts each being associated with a group of three cylinders 14, transports exhaust gas to a turbine end 22 of a turbocharger 20. The turbine end 22 drives a compressor end 24 which his configured to compress intake air before the air is introduced in the cylinders 14. A charge air cooler 30 is normally provided in the intake air flow path for cooling down the intake air, and an exhaust gas recovery system 40 may also be provided for increasing the fuel efficiency as well as for reducing emissions.

As indicated in FIG. 1 the ICE may be equipped with various sensors for monitoring and increasing ICE performance. As an example, a pressure sensor 50 and a temperature sensor 52 are provided in the intake port of the cylinders 14. An additional pressure sensor 54 is provided in the exhaust gas manifold 16, and further sensors 56, 58 are provided in the exhaust gas recovery flow path 40 for measuring pressure and temperature.

The sensors 50, 52, 54, 56, 58 may preferably be connected to an electronic control unit 60 which is capable of receiving sensors signals and perform various computation of these signals for determining the status of the ICE. The electronic control unit 60 may further provide output signals for controlling various parts of the ICE, such as air flow, fuel supply, etc in view of the received sensor signals.

Considering the turbocharger alone, the cost for real time sensors makes it very difficult to provide enough sensors for fully allow monitoring of turbocharger performance. For example, direct monitoring of the turbine efficiency requires pressure and temperature on both sides of the turbine as well as the turbine speed. The same applies for the compressor efficiency, resulting in nine unique sensors for determining turbocharger performance and efficiency. Since in most cases one or more of these sensors is lacking, it is necessary to provide other methods for monitoring the performance.

One such method, which will be described in the following paragraphs, applies a fault detection algorithm where engine performance is simulated off board, while comparing the results from the simulation with measured data is performed on board the vehicle.

Figure 2:
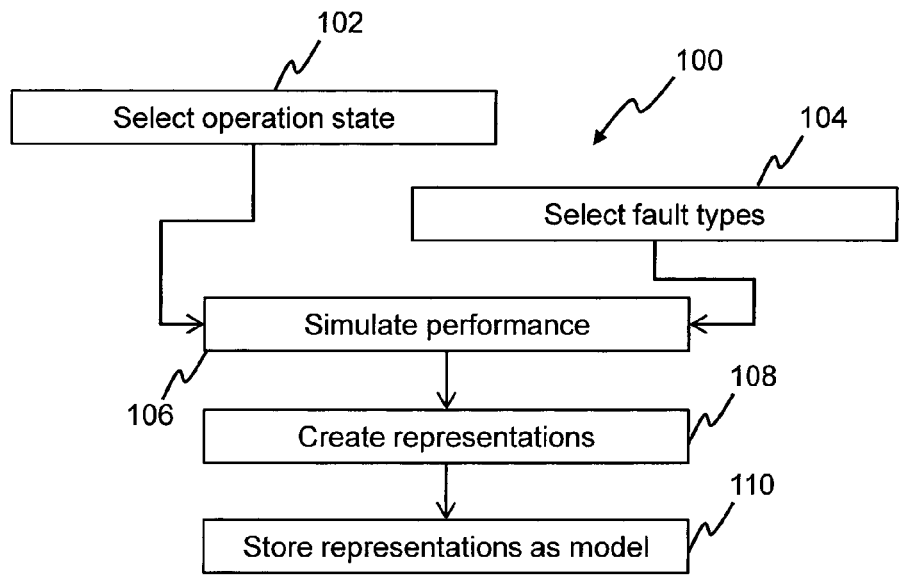
FIG. 2 illustrates a method according to an embodiment.

Now turning to FIG. 2, a method 100 will be described for creating a model of an ICE. In a first step 102 a specific operation state is determined. The operation state corresponds to static condition affecting ICE performance, such as a specific ambient pressure for a specific ambient temperature, or a specific torque for a specific engine speed. Alternatively, the operation state may correspond to a plurality of steady state driving conditions, such as a specific torque, speed, pressure, and temperature.

In a next step 104 one or more fault types are selected. The fault types are preferably identified and thereafter selected such that they represent characteristic faults which may occur during vehicle operation, such as air leakage in the exhaust gas flow path, air leakage in the charge air cooler, reduced efficiency of the charge air cooler, or reduced efficiency of the compressor of the turbocharger. Each fault type may further be associated with a magnitude, such that for air leakage in the exhaust gas flow path four different fault types are identified; no leakage, small leakage, medium leakage, or large leakage. A small leakage may e.g. correspond to a hole of 5 mm in diameter, while a medium leakage may e.g. correspond to a hole of 7 mm in diameter. A large leakage may correspond to a hole of 10 mm in diameter. For faults related to reduced efficiency several fault types may also be identified; e.g. one fault type corresponding to 0% reduction in efficiency (i.e. no fault), one fault type corresponding to 3% reduction in efficiency (i.e. a slight reduction), one fault type corresponding to 5% reduction in efficiency (i.e. a medium reduction), and one fault type corresponding to 10% reduction in efficiency (i.e. a high reduction).

Once the operation state and the fault types have been selected, ICE performance is simulated during step 106. The simulation is performed using the identified operation state as input, together with one of the fault types. Hence, in a situation where 16 fault types have been identified (four faults each having four different magnitudes), 16 simulations are needed for each operation state.

The simulation may preferably be performed in a computer-based simulation environment, or on a real engine rig. A computer-based simulation environment may for this purpose be developed for a particular engine type, and may be preferred when the fault types are selected as faults being difficult to reproduce on a real engine rig. Such faults may e.g. be turbine defects or compressor wheel damages corresponding to specific reductions in turbocharger efficiency.

The purpose of the simulation step 106 is to associate the identified operation state, together with a specific fault type, with one or more operating parameters which are significant for the particular ICE. Hence, the simulation requires a number of inputs (i.e. operation states and fault type) for providing one or more outputs, i.e. operating parameter values.

Steps 102 to 106 may be repeated for a plurality of operation states, such that several operation states are simulated for each one of the specific fault types.

Figure 3:
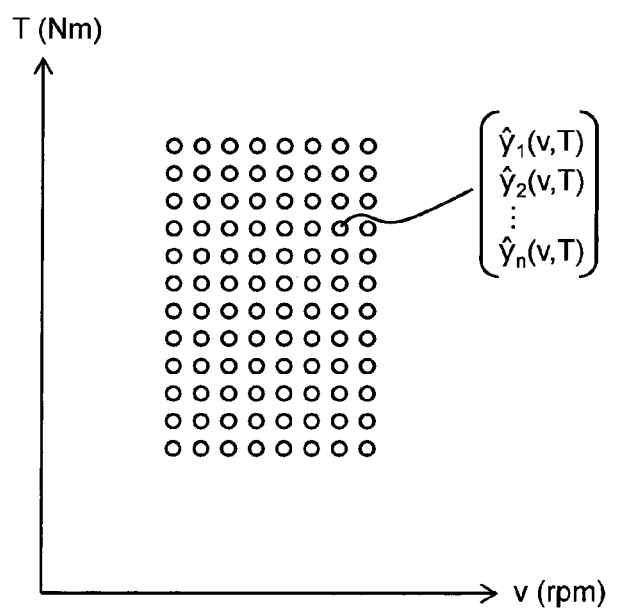
FIG. 3 is a diagram showing a representation according to an embodiment.

This is shown in FIG. 3, illustrating a map of a plurality of operation states for a specific fault type. Each circle defines a specific engine speed for a specific output torque. For all circles, the ambient pressure and the ambient temperature is constant. Each circle, thus corresponding to a specific operation state, results in a series of operating parameter values $\hat{y}_1$-$\hat{y}_n$. The operating parameters are thus calculated by the simulation step 106, and they preferably correspond to operating parameters which are measurable on board the vehicle and which are relevant for the identified fault types. It should be noted that FIG. 3 only shows one example of how the representations may be presented. In an embodiment, the representations are not stored in two dimensions, but instead in a multi-dimensional space in which each dimension corresponds to one input signal of the simulations, e.g. output torque, engine speed, ambient temperature, ambient pressure, or fault type. In the present example having 16 different fault types for the gas flow path of the ICE, $\hat{y}_1$-$\hat{y}_n$ may be selected to represent one or more from the group consisting of turbocharger boost pressure, turbocharger inlet pressure, turbocharger speed, turbocharger outlet temperature, turbocharger inlet temperature, and/or exhaust gas recovery temperature.

Another repetition of steps 102 to 106 may be performed, altering the ambient pressure and/or temperature. For example, decreasing the ambient pressure may correspond to high altitude driving, thus leading to a number of new simulations for different torques and engine speeds for each fault type.

The operation states are preferably identified and selected for representing frequently occurring steady state driving conditions, such as highway driving in normal temperature with or without heavy engine load. However, the operation states may also be identified and selected for specific operation states for which it is expected that a particular fault type has a more significant effect on engine performance, such as high altitude driving for determining a reduction in turbocharger compressor efficiency.

After repeating the simulations, a bundle of representations are created in step 108, each representation corresponding to a series of operating parameter values for a specific operation state and fault type. These representations are subsequently stored as a model in step 110 on board a vehicle. The model may be represented in several ways, e.g. as a look up table, or as a multi-dimensional polynomial for which the operating parameters are described as a function of operation state.

Figure 4:
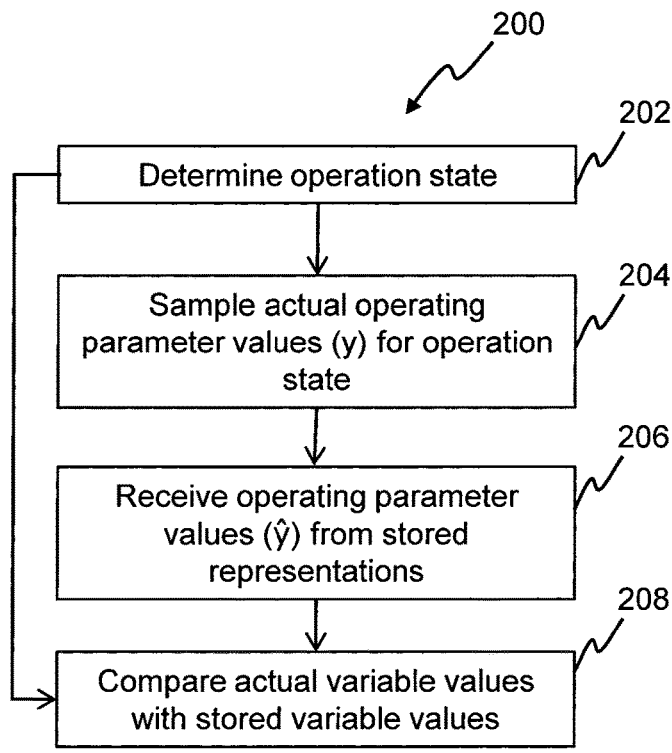
FIG. 4 illustrates a method according to a further embodiment.

Now turning to FIG. 4, a method 200 for determining faults in a vehicle will be described in general terms. The method 200 requires a model 100 as previously described stored on board the vehicle, and is performed in real-time on board a running vehicle.

Starting at step 202, the current operation state is determined, using on board sensors or signals. For example, in the present example step 202 determines the current output torque, the engine speed, the ambient temperature as well as the ambient pressure.

In step 204 actual values of one or more operating parameters is measured/sampled. The operating parameters are preferably selected such that they correspond to the operating parameters stored in the model, such as turbocharger boost pressure, turbocharger inlet pressure, turbocharger speed, turbocharger outlet temperature, turbocharger inlet temperature, and/or exhaust gas recovery temperature for the present embodiment. It should be noted that steps 202 and 204 may also be performed in reversed order, although it is preferable to actually determine the actual operating state before sampling values of specific operating parameters for those cases where there is no representation stored for the actual operation state.

In a subsequent step 206 the determined operation state is used for addressing the model stored on board the vehicle and made available for method 200. Hence, as a plurality of representations is available in the model, i.e. one for each fault type, pluralities of operating parameter values are received from the model.

The sampled values are compared with the operating parameter values for each representation, i.e. for each fault type, in step 208. By performing such comparison, it will be possible to identify which representation being most similar to the measured or sampled values. Hence, such step of identification results in a fault detection.

Figure 5:
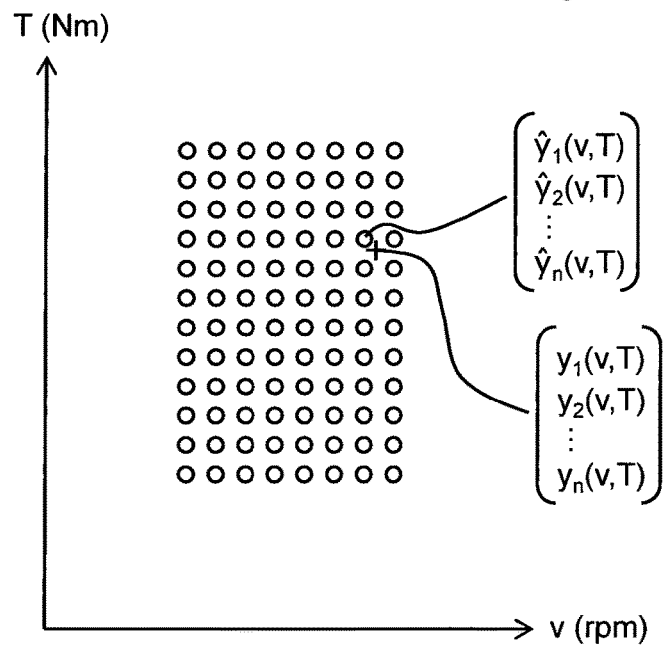
FIG. 5 is a diagram showing a representation relative actual engine performance according to an embodiment.

Now turning to FIG. 5, the method 200 samples real-time data indicated by the vector y1-yn. The actual operation state, determined in step 204 and corresponding to a specific torque for a specific engine speed is indicated by the cross sign. The diagram further shows the simulations for a specific temperature and pressure, whereby the actual operation state is close to a simulated operation state. Hence, the model outputs a series of operating parameter values $\hat{y}_1$-$\hat{y}_n$ to be compared with the actual values y1-yn. Optionally, the series of operating parameter values and/or the actual values may be interpolated to fit with one specific operation state.

Comparing the $\hat{y}$ vector with the y vector will thus indicate if there is a match or not, however by further comparing the $\hat{y}$ vector with other y vectors being associated with other fault types will enable the method to actually select the most similar $\hat{y}$ vector, thus indicating the present fault type.

Hence, by including fault types in the model it is possible to actually perform analysis of several fault types in a single comparison step.

The step 208 of comparing actual values with modeled values may be performed in various ways. In a preferred embodiment the method 200 includes the step of calculating residuals between the actual values and the modeled values. More preferably, each residual is calculated as a normalized residual r such that $$r_1 = \frac{\hat{y}_1 - y_1}{\hat{y}_1}$$

etc for each fault type. In a subsequent step, the normalized residuals may be used to calculate the variance of all residuals for a specific fault type. The step of comparing 208 thus includes comparing the variance for each fault type, and selecting the fault type that minimizes the variance.

In another embodiment the method 200, in step 208, normalizes model output, i.e. modeled operating parameter values, and actual values separately such that the residual r instead is calculated according to $$r_1 = \frac{\hat{y}_1}{\hat{y}_0} - \frac{y_1}{y_0},$$

where $\hat{y}_0$ and y0 are values corresponding to a fault free engine.

Figure 6:
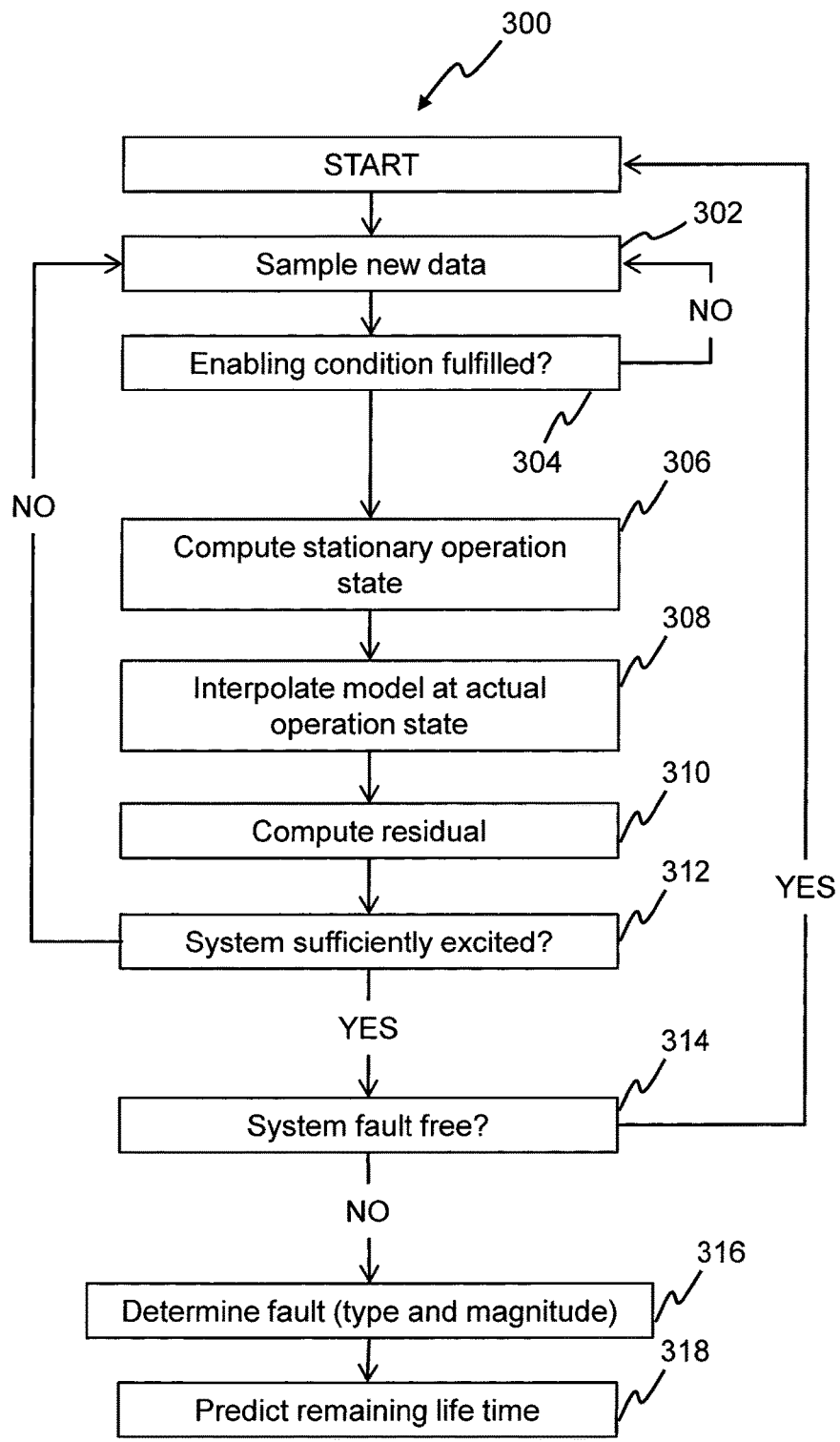
FIG. 6 illustrates a method according to a yet further embodiment.

Now turning, to FIG. 6, a more detailed description will be given for a specific embodiment of a method 300. The method 300 is similar to the method 200, i.e. it serves to detect faults by using a model created by the method 100 previously described.

When the vehicle is running, the method 300 may start automatically. In a first step 302 the method samples data corresponding to real time driving characteristics. The sampled data comprises operation state parameters, such as engine speed, output torque, and ambient conditions. However, the sampled data also includes determining operating parameter values, i.e. y1-yn. After step 302 a subsequent step 304 is performed, in which the sampled data is evaluated for determining if enabling conditions are fulfilled or not. Such evaluation may be based on one or more predetermined criteria, such as if i) the actual operating state has a corresponding representation stored in the model, ii) the vehicle is in a steady state driving condition, and iii) the sampled data signal accuracy is sufficient. As an example, step 304 may result in a negative evaluation if the ICE is recently started and thus being too cold, if the sample data signal is too weak or includes too much noise, and/or if the ICE is not in a steady state operation state.

If the evaluation is negative, i.e. if one or more of the predetermined conditions are not fulfilled, the method 300 returns to step 302 for sampling new data. On the other hand, if the evaluation is positive, i.e. if all conditions are fulfilled, the method continues to step 306 in which the actual operation state is determined. Hence, the sampled data from step 302 is here used for determining the current output torque, the current engine speed, as well as the current ambient conditions, such as temperature and pressure.

In step 308 the method 300 calls the model stored on board, and receives a plurality of representations for the actual operation state, each representation including a plurality of operating parameter values ŷ associated with a specific fault type. As the representations are modeled for specific operation states not necessarily having a perfect match with the actual operation state, it may be necessary to interpolate the received representations such that the plurality of operating parameter values are corrected in view of the actual operation state. Such interpolation may be performed in a number of ways, of which one example is to also receive representations for the second closest representations, and use the operating parameter values in such representations to correct the representations for the closest operation state.

In a subsequent step 310 residuals are computed, in accordance with what has previously been described. Hence, step 310 may result in one residual vector for each received representation, i.e. one residual vector for each fault type.

Step 312 is performed for ensuring a sufficient statistical selection. Hence, in order to provide a fully reliable system several measurements should be performed, thus resulting in a set of residuals. For providing such set of residuals, steps 302 to 310 may be repeated for a number of times. However, since steps 302 to 310 are performed in real time without any major strains on processing power, a vast amount of samples and corresponding residuals may be provided in a very short time.

Once step 312 confirms that the method 300 is sufficiently excited, i.e. the calculated residuals are statistically reliable, the method 300 evaluates the residuals calculated for the representation corresponding to a no-fault situation. If there is a perfect match, the method 300 may determine the ICE as fault free in step 314 and thereafter return to step 302 for sampling new data, starting all over again.

However, if the evaluation of the no-fault representation residual reveals a specific deviance, preferably by evaluating the variance of the residuals in accordance with what has previously been described, the method 300 proceeds with step 316 where the residuals are evaluated for all representations, i.e. for all fault types. The method 300 may thus be configured to select the representation, i.e. fault type, for which the variance of the residuals are at a minimum. Such selection results in a fault detection and determination.

An optional step 318 is also possible, in which the remaining life time is estimated or predicted. Such prediction may be based on predetermined data which defines specific situations where service or maintenance is required. Using the example above, a small leakage may not require downtime of the vehicle, but a large leakage will. Hence, by detecting a small leakage, and continuously monitoring the small leakage by performing the method 300 repeatedly, it may be possible to actually determine the rate at which the leakage is growing bigger. It may therefore be possible to estimate the future running time before the leakage is needed to be taken care of, and also to schedule maintenance on beforehand. The method 300 may consequently be used for reducing unplanned operational disturbance which is a major concern for the vehicle owner and/or operator.

The method 300 may thus be capable of determining faults in a vehicle, as well as monitoring the trends of the faults.

Preferably, the method 200, 300 is stored on board a vehicle, such as in a memory of an electronic control unit (60) as shown in FIG. 1.

Although the different methods have been described with reference to a gas flow path of an ICE, it should be noted that the methods 100, 200, 300 may also be performed for other critical parts of a vehicle. For example, the methods may be used for a braking system for monitoring and detecting faults occurring in such systems.

In such embodiment, the operation state may be selected as a specific temperature of the braking disc(s), a specific angular speed of the wheels, a specific hydraulic pressure, and a specific brake pedal position. Correspondingly, model output, i.e. operating parameter values, may be selected from the group consisting of deceleration, friction, slip, tear, etc. Fault types may e.g. be selected as loss of efficiency in the hydraulic system, leakage in oil conduits, deposits on braking discs, etc. As long as it is possible to simulate the specific part or system with regards to specific operation states and specific fault types the method 100 may be used to create models for such part or system, wherein the model is based on representations for different operation states and fault types. Correspondingly, an on board model according to what has been described with reference to FIGS. 4 and 6 may be used to actually perform real time fault detection and monitoring using such model. By comparing the residuals between actual values sampled in real time and model output values a very efficient and reliable fault detection can be performed, leading to a possibility to actually provide a prediction for future service and maintenance.

In a yet further embodiment, the method 100 may be performed for creating a model which also is applicable to combination errors. For example, it may be possible to simulate ICE performance for an air leakage as well as a reduction in compressor efficiency. Representations for such combination fault may thus be stored in the model, whereby the method 200, 300 easily detects such combination error by also adding this representation when comparing residuals. The proposed methods are thus very versatile and may easily be adjusted to other fault types, including combination errors. This also applies to other parts of the vehicle, such as the braking system as previously been described.

It will be appreciated that the embodiments described in the foregoing may be combined without departing from the scope as defined by the appended claims.

In the claims, the term "comprises/comprising" does not exclude the presence of other elements or steps. Additionally, although individual features may be included in different claims, these may possibly advantageously be combined, and the inclusion in different claims does not imply that a combination of features is not feasible and/or advantageous. In addition, singular references do not exclude a plurality. The terms "a", "an", etc do not preclude a plurality.

The invention claimed is:

1. A method for identifying faults of a part of a vehicle during operation, comprising:
    determining an actual operation state of the vehicle part;
    receiving a value of at least one operating parameter from each one of a plurality of stored fault representations, each of the stored representations being obtained by selecting at least one operation state;
    selecting at least one possible fault type for the vehicle part;
    simulating vehicle part performance for the at least one operation state during the occurrence of the at least one possible fault type;
    for each simulation creating a fault representation of the vehicle part performance in which each fault representation is associated with at least one operating parameter value;
    simulating vehicle part performance for the at least one operation state with no fault type occurring;
    for the simulation with no fault type occurring creating a no fault representation of the vehicle part performance in which the no fault representation is associated with at least one operating parameter value; and
    storing the at least one fault representation and the at least one no fault representation;
    detecting at least one actual value of the at least one operating parameter;
    identifying a specific fault type associated with a specific fault representation for which the at least one received operating parameter value is most similar to the at least one detected actual operating parameter value by computing normalized residuals between the received operating parameter values and the at least one detected actual operating parameter value for each one of the fault representations, and identifying as the specific fault type one of the fault representations for which the normalized residuals have a minimum variance; and
    performing maintenance on the vehicle in response to identification of the specific fault type.

2. The method according to claim 1, wherein the at least one operation state corresponds to a specific driving characteristics for a specific surrounding condition.

3. The method according to claim 1, wherein the at least one possible fault type corresponds to a specific fault with a specific magnitude.

4. The method according to claim 1, wherein the step of simulating vehicle part performance is performed for each one of the at least one operation state during the occurrence of each one of the at least one possible fault type, resulting in a set of unique simulations.

5. The method according to claim 1, wherein the vehicle part is an internal combustion engine, or parts thereof, and wherein each one of the fault representations is a series of operating parameter values for a specific output torque, a specific engine speed, a specific ambient condition, and a specific fault type.

6. The method according to claim 1, wherein the vehicle part is an internal combustion engine, and wherein the at least one operating parameter is selected from the group consisting of: turbocharger boost pressure, turbocharger inlet pressure, turbocharger speed, turbocharger outlet temperature, turbocharger inlet temperature, and/or exhaust gas recovery temperature.

7. The method according to claim 1 wherein the step of detecting at least one operating parameter value is repeated for detecting a series of actual values for the at least one operating parameter.

8. The method according to claim 1, confirming that the normalized residuals are statistically reliable by performing a plurality of measurements, resulting in a plurality of residuals.

* * * * *